(12) United States Patent
Koellnberger

(10) Patent No.: US 9,334,435 B2
(45) Date of Patent: May 10, 2016

(54) ABRADABLE SILICONE ELASTOMER COMPOUND AND USE THEREOF

(71) Applicant: Wacker Chemie AG, Munich (DE)

(72) Inventor: Andreas Koellnberger, Kirchdorf (DE)

(73) Assignee: WACKER CHEMIE AG, Munich (DE)

( * ) Notice: Subject to any disclaimer, the term of this patent is extended or adjusted under 35 U.S.C. 154(b) by 0 days.

(21) Appl. No.: 14/443,325

(22) PCT Filed: Oct. 22, 2013

(86) PCT No.: PCT/EP2013/072096
§ 371 (c)(1),
(2) Date: May 15, 2015

(87) PCT Pub. No.: WO2014/075879
PCT Pub. Date: May 22, 2014

(65) Prior Publication Data
US 2015/0299533 A1    Oct. 22, 2015

(30) Foreign Application Priority Data

Nov. 16, 2012    (DE) .......................... 10 2012 220 954

(51) Int. Cl.
| | | |
|---|---|---|
| H01L 21/00 | (2006.01) |
| C09J 183/04 | (2006.01) |
| H01L 23/00 | (2006.01) |
| C08G 77/12 | (2006.01) |
| C08L 83/04 | (2006.01) |
| G02B 1/04 | (2006.01) |

(52) U.S. Cl.
CPC ............... C09J 183/04 (2013.01); C08G 77/12 (2013.01); C08L 83/04 (2013.01); G02B 1/04 (2013.01); H01L 24/01 (2013.01)

(58) Field of Classification Search
None
See application file for complete search history.

(56) References Cited

U.S. PATENT DOCUMENTS

| | | | | |
|---|---|---|---|---|
| 5,674,966 A * | 10/1997 | McDermott | ........... | C08G 77/20 525/477 |
| 5,696,210 A * | 12/1997 | King | ................... | C08F 299/08 525/478 |
| 6,124,407 A * | 9/2000 | Lee | ......................... | C08L 83/04 257/E23.12 |
| 6,313,190 B1 | 11/2001 | Bublewitz et al. | | |
| 6,623,864 B1 * | 9/2003 | Sweet | ....................... | B32B 7/12 428/447 |
| 6,703,120 B1 * | 3/2004 | Ko | .......................... | C09J 183/04 428/351 |
| 2002/0161140 A1 | 10/2002 | Yoneda et al. | | |
| 2004/0121618 A1 | 6/2004 | Moore | | |
| 2004/0122142 A1 * | 6/2004 | Meguriya | ................ | C08L 83/04 524/268 |
| 2005/0137328 A1 | 6/2005 | Staiger et al. | | |
| 2007/0256795 A1 * | 11/2007 | Christian | ............... | B60J 7/0015 160/120 |
| 2012/0065343 A1 * | 3/2012 | Bahadur | ................. | C08L 83/04 525/478 |
| 2012/0095109 A1 * | 4/2012 | Garaud | .................. | C08G 77/12 514/772.3 |
| 2013/0186564 A1 | 7/2013 | Keller et al. | | |

FOREIGN PATENT DOCUMENTS

| | | |
|---|---|---|
| EP | 0 603 514 A2 | 6/1994 |
| EP | 0 838 086 B1 | 4/1998 |
| EP | 0 894 117 B1 | 9/1999 |
| EP | 1 544 253 A2 | 6/2005 |
| EP | 1 749 861 A1 | 2/2007 |
| EP | 1 089 326 A1 | 3/2007 |
| WO | 2009/003029 A2 | 12/2008 |
| WO | 2009/094558 A2 | 7/2009 |
| WO | 2012/049020 A1 | 4/2012 |

* cited by examiner

*Primary Examiner* — Marc Zimmer
(74) *Attorney, Agent, or Firm* — Brooks Kushman P.C.

(57) ABSTRACT

Addition curing silicone elastomers of high Shore D hardness are grindable and polishable, and are particularly useful as temporary adhesives in the processing of semiconductor wafers.

5 Claims, No Drawings

ABRADABLE SILICONE ELASTOMER COMPOUND AND USE THEREOF

CROSS REFERENCE TO RELATED APPLICATIONS

This application is the U.S. National Phase of PCT Appln. No. PCT/EP2013/072096 filed Oct. 22, 2013, which claims priority to German Application No. 10 2012 220 954.9 filed Nov. 16, 2012, the disclosures of which are incorporated in their entirety by reference herein.

BACKGROUND OF THE INVENTION

1. Field of the Invention

The present invention relates to a product formulation based on silicone elastomer compositions for the temporary adhesive bonding to a carrier substrate of a workpiece that is to be ground or polished, wherein the silicone elastomer composition is grindable or polishable after curing.

2. Description of the Related Art

The expression "temporary adhesive bonding" refers to the joining of two substrates which are to be detached again at a suitable point in time. Workpieces may have to be fixed mechanically for a grinding operation. In the case of high-priced workpieces for example, gemstones, optical lenses, works of art or semiconductor wafers, this often causes damage to the workpiece, or the fixing does not have the desired stability. There is therefore a need for alternative fastening methods. One possibility consists in fixing the workpiece by means of temporary adhesive bonding. Because it is unavoidable in the operation of grinding or polishing that the grinding device may also come into contact with the adhesive, the adhesive must also be grindable since it would otherwise lead, for example, to material failures or contamination or damage to the grinding apparatus. In addition, good temperature resistance to over 300° C. is necessary to withstand the friction, and thus the temperature increase, caused by the grinding or polishing. Temperature resistance is additionally necessary because subsequent processing steps carried out on the workpiece can take place in a high temperature range. Chemical resistance is also an important property for such an adhesive, such as resistance to cleaning chemicals. Current market requirements for semiconductor components are directed to ever smaller overall heights. One possibility for reducing the overall height of a molded component such as a chip is to thin the wafer that is used. This is effected by a grinding operation and can be carried out before or after dicing.

However, this step leads to a reduction in the structural strength of the wafer. As a result, the large, thin wafers can break during processing by means of the devices and materials that are conventionally used, such as the dicing tapes that are employed today, owing to a lack of mechanical support. In addition, the wafer structures (bumps) which protrude by up to 100 μm or more may in some cases not be enclosed completely or include voids caused by the tapes (adhesive films) that are used today, so that the voids that remain generally lead to damage or impairment of the thin wafer during processing in vacuo. A possible process-related solution to this problem is to bond the wafer to a hard substrate (for example to another wafer or a wafer carrier, for example glass) by means of a temporary adhesive layer, in order to increase its mechanical strength, then carry out the desired processing operations, and subsequently detach the wafer, which is then only 10-100 μm thick, from the substrate again. The substrate attached by means of the temporary adhesive layer serves as a mechanical reinforcement during the grinding operation and subsequent processing operations.

The later post-processing of the thinned wafer also includes the creation of resist structures by plasma etching and operations such as metal plating and the cleaning of residues.

Further important aspects are the minimal release of volatile by-products and the viscosity of the uncrosslinked silicone elastomer composition, in order, for example, to minimize the risk of contamination and health risks, and to permit suitable application to the workpiece. In addition, it must be possible after grinding or polishing to detach the adhesive from the workpiece simply, leaving as little residue as possible.

In the semiconductor industry there is, therefore, a need for an adhesive for a temporary wafer bonding process, the properties of which allow the wafer to be processed without breaking or being damaged. The adhesive must be suitable for application by an industrially viable process (for example spray coating, printing, dipping, spin coating) and must be able to be detached from the wafer at the desired point in time by suitable processes without leaving a residue.

The necessary fastening of the supporting substrate to the wafer prior to thinning could ideally be effected by thermoplastic or elastic polymers, whereby the front structures of the wafer must be enclosed in a supporting manner.

Several possibilities for temporary adhesive bonding to a carrier are described in the prior art, but they have various disadvantages.

One possibility of fixing the semiconductor wafer to a carrier is provided by so-called "adhesive tapes". EP 0838086 B1 describes a tape made of a thermoplastic elastomer block copolymer for use in the processing of semiconductor wafers. However, the limited elasticity of the material leads to problems with the use of wafers having surface structures ("bumped wafers"). The thermoplastic properties of the material additionally lead to reduced heat stability. This is an important requirement, however, for the back-side operations (plasma processes, CVD, etc.) that follow the thinning of the wafer ("back-side grinding").

WO 2009/003029 A2 claims thermoplastic organic polymers (imides, amideimides and amideimide-siloxanes) for use as a temporary adhesive between a wafer and a carrier. WO 2009/094558 A2 describes the temporary adhesive bonding of a wafer and a carrier, wherein the adhesive bonding does not take place over the entire surface but only in the edge region. When the grinding process and any back-side operations have been carried out, the adhesive bond is destroyed chemically, photochemically, thermally or thermo-mechanically. EP0603514 A2 describes a method for thinning a semiconductor wafer, wherein the adhesive material used is suitable for a maximum of 200° C. In US application US2004/0121618 A1, a liquid adhesive suitable for spin-coating processes is described which consists of a thermoplastic polyurethane as well as dimethylacetamide and propylene glycol monomethyl ether as the main components. All these proposals have the disadvantage of reduced heat stability of the cured adhesive.

EP1089326 B1 claims a carrier for wafers which consists of a silicone elastomer covered with a dust-tight film, wherein the separating force between the film and the silicone layer is from 5 to 500 g/25 mm (according to JIS K 6854). The disadvantage is that this film must be removed in an additional process step before the carrier is used, so that the adhesive is accessible.

SUMMARY OF THE INVENTION

An object of the present application was, therefore, to provide a suitable adhesive for the reversible fixing of workpieces, which is grindable or polishable after curing and is resistant to heat and chemicals. In addition, the adhesive must be able to be applied with a minimal number of simple process steps, and to be removed from the workpiece again without difficulty, without damaging or contaminating the workpiece or the grinding or polishing device. A further object was to provide an adhesive with good mechanical strength towards compressive stress, which is particularly important when adhesively bonded thin workpieces are subject to compressive stress over a small area.

These and other objects have been achieved, surprisingly, by an addition-crosslinkable silicone elastomer compositions, comprising (A1) 1-10% by weight of at least one linear organopolysiloxane containing at least 2 SiC-bonded radicals having aliphatic carbon-carbon multiple bonds, wherein the mean molar mass of (A1) is not more than 15,000 g/mol, (A2) 1-20% by weight of at least one linear organopolysiloxane containing at least 2 SiC-bonded radicals having aliphatic carbon-carbon multiple bonds, wherein the mean molar mass of (A2) is at least 40,000 g/mol, (B) 1-40% by weight of at least one organopolysiloxane containing at least three Si-bonded hydrogen atoms per molecule, having a content of Si-bonded hydrogen of from 0.04 to 1.7% by weight and a mean molar mass of not more than 20,000 g/mol, (D) 1-100 ppm (based on the metal) of a hydrosilylation catalyst, (E) 50-99% by weight of at least one branched silicone resin of the general empirical formula (I)

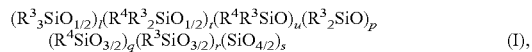

$$(R^3{}_3SiO_{1/2})_l(R^4R^3{}_2SiO_{1/2})_t(R^4R^3SiO)_u(R^3{}_2SiO)_p(R^4SiO_{3/2})_q(R^3SiO_{3/2})_r(SiO_{4/2})_s \quad (I),$$

wherein
$R^3$ denotes a linear aliphatic radical,
$R^4$ denotes an aliphatic unsaturated radical having a terminal C=C double bond,
l, t, u, p, q, r and s denote integers,
wherein the following apply:
$l \geq 0$, $t \geq 0$, $u \geq 0$, $p \geq 0$, $q \geq 0$, $r \geq 0$ and $s \geq 0$; and
the content of aliphatic unsaturated groups in (E) is between 0.2 and 10 mmol/g; and
(E) has a mean molar mass of not more than $10^5$ g/mol,
with the proviso that the ratio of the Si—H groups provided by component (B) to the aliphatically unsaturated groups provided by components (A1), (A2) and (E) is between 0.5 and 5 and the ratio of the dynamic viscosity of the silicone elastomer composition at shear rates of 1 s$^{-1}$ and 100 s$^{-1}$ and a temperature of 20° C. is not more than 1.2 and after crosslinking has a Shore D hardness of at least 25.

DETAILED DESCRIPTION OF THE PREFERRED EMBODIMENTS

The silicone elastomer compositions according to the invention can be applied to the substrates by conventional industrial processes (for example spray coating, printing, dipping, spin coating).

They further exhibit approximately Newtonian flow behavior with low shear thinning (no gel state at zero shear), in order to ensure the application of a uniform layer thickness over the entire wafer or substrate. The silicone elastomer compositions according to the invention have a ratio of dynamic viscosity at shear rates of 1 s$^{-1}$ and 100 s$^{-1}$ at 20° C. of not more than 1.2; preferably not more than 1.1; particularly preferably not more than 1.05. The dynamic viscosity of the silicone elastomer compositions at 20° C. and a shear rate of 1 s$^{-1}$ is between 10 and 20,000 mPa·s, preferably between 50 and 10,000 mPa·s and most preferably between 500 and 5000 mPa·s.

The silicone elastomer compositions according to the invention have very low contents of volatile constituents, in order to prevent contamination and blistering during processing, even in vacuo and with the simultaneous action of heat. The difference in mass of the cured silicone rubber between room temperature and 300° C. in a thermogravimetric analysis (TGA), at a rate of heating of 10 K/min to 300° C. and under an air or nitrogen stream of 30 ml/min, is not more than 2% by weight, preferably not more than 1% by weight and most preferably not more than 0.5% by weight. They further exhibit low rates of subsequent formation of volatile constituents.

The silicone rubber according to the invention is prepared after application by crosslinking of the silicone elastomer compositions according to the invention and forms the reversible adhesive layer between the workpiece and the substrate.

The crosslinked silicone rubber so prepared exhibits a Shore D hardness according to DIN 53505 of between 25 and 80, preferably between 25 and 75 and most preferably between 30 and 65; tear propagation resistance according to ASTM D624-B-91 of at least 2 N/mm, preferably at least 5 N/mm; elongation at break according to DIN 53504-85S1 of not more than 100%, preferably not more than 50%; and tear strength according to DIN 53504-85S1 of not more than 8 N/mm$^2$, preferably not more than 5 N/mm$^2$. The mechanical strength towards compressive stress is given by the flexural modulus from the 3-point flexural test. The flexural modulus according to EN ISO 178 of the silicone rubbers according to the invention is at least 30 N/mm$^2$, preferably at least 50 N/mm$^2$ and particularly preferably at least 70 N/mm$^2$.

Advantages of the silicone rubbers according to the invention are that, owing to the unusually high Shore D hardness for an elastomer and the above-mentioned mechanical values, they are grindable or polishable. The modulus of elasticity, which is increased significantly compared with other silicone elastomers, ensures that even a thin workpiece does not break or is not damaged under punctual compressive stress. The silicone rubbers according to the invention can additionally be detached from the workpiece by suitable processes at the desired point in time without leaving a residue. On separation of the bond between the wafer and the carrier, the silicone rubber layer in most cases remains complete either on the side of the carrier or on the side of the wafer. Removal of the silicone rubber layer can be carried out, for example, with the aid of an adhesive tape, whereby the silicone rubber layer, after contact with the adhesive tape, is detached from the wafer or carrier surface with the adhesive tape. In an alternative process, the silicone rubber layer can be removed with the aid of suitable solvents and depolymerization agents known in the prior art.

The silicone rubbers according to the invention have high temperature stability, >250° C. over several hours and, at peaks, up to >300°. Under a temperature load of 250° C. over a period of one hour, the mechanical properties change only minimally. An increase in the Shore hardness of a maximum of 5 points, preferably a maximum of 3 points and most preferably a maximum of 2 points is observed. The elongation at break is lower by a maximum of 5%, preferably by a maximum of 3%, and the tear strength falls by a maximum of 5 N/mm$^2$, preferably by a maximum of 3 N/mm$^2$ and most preferably by a maximum of 1 N/mm$^2$. The tear propagation resistance falls by a maximum of 3 N/mm, preferably by a maximum of 2 N/mm and most preferably by a maximum of 1 N/mm. The flexural modulus changes by a maximum of 10%, preferably by a maximum of 5%.

The crosslinkable silicone elastomer compositions according to the invention have the advantage that they can be prepared in a simple process using readily available starting materials, and can thus be prepared economically. In addition, as a one-component formulation, they have good storage stability at 25° C. and ambient pressure and crosslink rapidly only at elevated temperature. The silicone compositions according to the invention have the advantage that, in a two-component formulation, after mixing of the two components, they yield a crosslinkable silicone composition, the processability of which is retained over a long period of time at 25° C. and ambient pressure. Accordingly, they exhibit extremely long pot lives and crosslink rapidly only at elevated temperature.

Formulating the silicone compositions according to the invention as a two-component formulation has the advantage that higher crosslinking speeds can be achieved compared with one-component compositions, which can lead to shorter processing times during production.

The use of the silicone elastomer compositions of the invention is very varied because, as well as being used for temporary adhesive bonding, such as, for example, in wafer production, they can also be used for the production of moldings, for adhesive bonding in general, but also for optical applications. The silicone elastomer compositions of the invention can be processed by all processes known in the prior art, for example, casting, molding, extrusion, etc. The field of application extends from compositions for moldmaking applications, the production of optical moldings such as, for example, lenses, disks, light guides, through compositions for the production of thin layers or coatings, to extruded products such as hoses, profiles, etc.

The silicone elastomer compositions according to the invention further have the advantage that they have high transparency. The transmission in the wavelength range between 400 and 800 nm is >90%, preferably >95%. For this reason, these materials are suitable for all optical applications such as, for example, LED lenses or the adhesive bonding of transparent materials. They are also suitable for the adhesive bonding of non-transparent materials. In combination with the high Shore D hardness, the products produced from the compositions according to the invention are suitable for producing therefrom transparent articles or moldings which have hitherto been produced from other transparent materials such as, for example, glass, polycarbonate (PC), polystyrene, polyethylene terephthalate (PET), polybutylene terephthalate (PBT), polyethylene terephthalate glycol-modified (PETG), polymethyl methacrylate (PMMA), polyethylene (PE), polypropylene (PP), etc. The moldings so produced can additionally be after-processed, for example by grinding or polishing.

The silicone elastomer compositions according to the invention can be one-component silicone compositions as well as two-component silicone compositions. In the latter case, the two components of the compositions according to the invention can contain all the constituents in any desired combination, generally with the proviso that one component does not simultaneously comprise siloxanes having aliphatic multiple bond, siloxanes having Si-bonded hydrogen and catalyst, that is to say substantially does not simultaneously comprise constituents (A1), (A2), (B) and (D). However, the compositions according to the invention are preferably one-component compositions. The silicone elastomer compositions according to the invention, in particular the one-component composition, are prepared by mixing all the constituents according to the prior art.

Compounds (A1), (A2) and (B) used in the addition-crosslinking compositions according to the invention are so chosen such that crosslinking is possible. Thus, for example, compounds (A1) and (A2) may contain at least two aliphatically unsaturated radicals and (B) contains at least three Si-bonded hydrogen atoms, or compounds (A1 and (A2)) may contain at least three aliphatically unsaturated radicals and (B) contains at least two Si-bonded hydrogen atoms.

As organosilicon compounds (A1) and (A2) containing SiC-bonded radicals having aliphatic carbon-carbon multiple bonds, linear organopolysiloxanes comprising units of the general formula (II) are preferably used:

$$R_a R^1_b SiO_{(4-a-b)/2} \quad (II)$$

wherein
R are identical or different and, independently of one another, denote an organic or inorganic radical that is free of aliphatic carbon-carbon multiple bonds,
$R^1$ are identical or different and, independently of one another, denote a monovalent, substituted or unsubstituted, SiC-bonded hydrocarbon radical having at least one aliphatic carbon-carbon multiple bond,
a is 1, 2 or 3, and
b is 1 or 2,
with the proviso that the sum a+b is less than or equal to 3 and at least 2 radicals $R^1$ are present per molecule, and
wherein the mean molar mass of (A1) is not more than 20,000 g/mol, preferably not more than 18,000 g/mol and most preferably not more than 15,000 g/mol, and
the mean molar mass of (A2) is at least 35,000 g/mol, preferably at least 40,000 g/mol and most preferably at least 45,000 g/mol.

The radical R can be mono- or polyvalent radicals, wherein the polyvalent radicals, such as, for example, divalent, trivalent and tetravalent radicals, then join together a plurality of siloxy units of formula (II), such as, for example, two, three or four siloxy units of formula (II).

Further examples of R are the monovalent radicals —F, —Cl, —Br, $OR^2$, —CN, —SCN, —NCO and SiC-bonded, substituted or unsubstituted hydrocarbon radicals, which can be interrupted by oxygen atoms or the group —C(O)—, as well as divalent radicals Si-bonded on both sides according to formula (II). If the radical R is SiC-bonded, substituted hydrocarbon radicals, preferred substituents are halogen atoms, phosphorus-containing radicals, cyano radicals, —$OR^2$, —$NR^2$—, —$NR^2_2$, —$NR^2$—C(O)—$NR^2_2$, —C(O)—$NR^2_2$, —$C(O)R^2$, —$C(O)OR^2$, —$SO_2$-Ph and —$C_6F_5$, wherein $R^2$, which are identical or different, independently of one another denote a hydrogen atom or a monovalent hydrocarbon radical having from 1 to 20 carbon atoms and Ph is the phenyl radical.

Examples of radicals R are alkyl radicals such as the methyl, ethyl, n-propyl, isopropyl, n-butyl, isobutyl, tert-butyl, n-pentyl, isopentyl, neopentyl, and tert-pentyl radicals, hexyl radicals such as the n-hexyl radical, heptyl radicals such as the n-heptyl radical, octyl radicals such as the n-octyl radical, and isooctyl radicals such as the 2,2,4-trimethylpentyl radical, nonyl radicals such as the n-nonyl radical, decyl radicals such as the n-decyl radical, dodecyl radicals such as the n-dodecyl radical, and octadecyl radicals such as the n-octadecyl radical; cycloalkyl radicals such as the cyclopentyl, cyclohexyl, cycloheptyl and methylcyclohexyl radicals; aryl radicals such as the phenyl, naphthyl, anthryl and phenanthryl radicals, alkaryl radicals such as the o-, m-, and p-tolyl radicals, xylyl radicals and ethylphenyl radicals; and aralkyl radicals such as the benzyl radical, and the α- and the β-phenylethyl radicals.

Examples of substituted radicals R are haloalkyl radicals such as the 3,3,3-trifluoro-n-propyl radical, the 2,2,2,2',2',2'-hexafluoroisopropyl radical, and the heptafluoroisopropyl radical; haloaryl radicals such as the o-, m- and p-chlorophenyl radicals, $-(CH_2)-N(R^2)C(O)NR^2{}_2$, $-(CH_2)_n-C(O)NR^2{}_2$, $-(CH_2)_n-C(O)R^2$, $-(CH_2)_n-C(O)OR^2$, $-(CH_2)_n-C(O)NR^2{}_2$, $-(CH_2)-C(O)-(CH_2)_mC(O)CH_3$, $-(CH_2)-O-CO-R^2$, $-(CH_2)-NR^2-(CH_2)_m-NR^2{}_2$, $-(CH_2)_n-O-(CH_2)_mCH(OH)CH_2OH$, $-(CH_2)_n(OCH_2CH_2)_mOR^2$, $-(CH_2)_n-SO_2-Ph$ and $-(CH_2)_n-O-C_6F_5$, wherein $R^2$ and Ph have the meaning given above therefor and n and m denote identical or different integers between 0 and 10.

Examples of R as divalent radicals Si-bonded on both sides according to formula (II) are those which are derived from the monovalent examples mentioned above for the radical R in that an additional bond is obtained by substitution of a hydrogen atom: $-(CH_2)-$, $-CH(CH_3)-$, $-C(CH_3)_2-$, $-CH(CH_3)-CH_2-$, $-C_6H_4-$, $-CH(Ph)-CH_2-$, $-C(CF_3)_2-$, $-(CH_2)_n-C_6H_4-(CH_2)_n-$, $-(CH_2)_n-C_6H_4-C_6H_4-(CH_2)_n-$, $-(CH_2O)_m-$, $(CH_2CH_2O)_m-$, $-(CH_2)_n-O_x-C_6H_4-SO_2-C_6H_4-O_x-(CH_2)_n-$, wherein x is 0 or 1 and Ph, m and n have the meaning given above.

The radical R is preferably a monovalent, SiC-bonded, optionally substituted hydrocarbon radical having from 1 to 18 carbon atoms that is free of aliphatic carbon-carbon multiple bonds, more preferably a monovalent, SiC-bonded hydrocarbon radical having from 1 to 6 carbon atoms that is free of aliphatic carbon-carbon multiple bonds, and in particular the methyl or phenyl radicals.

The radical $R^2$ can be any desired groups amenable to an addition reaction (hydrosilylation) with an SiH-functional compound. If the radical $R^2$ is SiC-bonded, substituted hydrocarbon radicals, preferred substituents are halogen atoms, cyano radicals and $-OR^2$, wherein $R^2$ has the meaning given above.

The radical $R^2$ is preferably an alkenyl or alkynyl radical having from 2 to 16 carbon atoms, such as the vinyl, allyl, methallyl, 1-propenyl, 5-hexenyl, ethynyl, butadienyl, hexadienyl, cyclopentenyl, cyclopentadienyl, cyclohexenyl, vinylcyclohexylethyl, divinylcyclohexylethyl, norbornenyl, vinylphenyl and styryl radicals, with vinyl, allyl and hexenyl radicals most preferably being used.

As organopolysiloxanes (B) containing Si-bonded hydrogen atoms there linear organopolysiloxanes comprising units of the general formula (III) are preferably used:

$$R_cH_dSiO_{(4-c-d)/2} \qquad (III)$$

wherein
R has the meaning given above,
c is 0, 1 2 or 3, and
d is 0, 1 or 2,
with the proviso that the sum of c+d is less than or equal to 3 and at least two Si-bonded hydrogen atoms are present per molecule, the content of Si-bonded hydrogen is from 0.04 to 1.7% by weight, and the mean molar mass is not more than 20,000 g/mol.

Organopolysiloxane (B) preferably contains Si-bonded hydrogen in the range from 0.04 to 1.7% by weight, based on the total weight of the organopolysiloxane (B). Most preferably, component (B) contains between 0.5 and 1.7% by weight of Si-bonded hydrogen.

The mean molar mass of (B) is not more than 20,000 g/mol, more preferably not more than 10,000 g/mol.

The structure of the molecules forming constituent (B) is also not fixed; in particular, the structure of a higher molecular weight, that is to say oligomeric or polymeric, SiH-containing siloxane can be linear. Linear polysiloxanes (B) are preferably composed of units of the formula $R_3SiO_{1/2}$, $HR_2SiO_{1/2}$, $HRSiO_{2/2}$ and $R_2SiO_{2/2}$, wherein R has the meaning given above.

Of course, mixtures of different siloxanes that satisfy the criteria of constituent (B) can also be used. In particular, the molecules forming constituent (B), as well as containing the obligatory SiH groups, can optionally also comprise aliphatically unsaturated groups. Particular preference is given to the use of low molecular weight SiH-functional compounds such as tetrakis(dimethylsiloxy)silane and tetramethylcyclotetrasiloxane, as well as higher molecular weight, SiH-containing siloxanes, such as poly(hydrogen-methyl)siloxane and poly(dimethylhydrogenmethyl)siloxane having a viscosity at 25° C. of from 10 to 10,000 mPa·s, or analogous SiH-containing compounds in which some of the methyl groups have been replaced by 3,3,3-trifluoropropyl or phenyl groups.

Constituent (B) is preferably present in the crosslinkable silicone compositions according to the invention in an amount such that the molar ratio of SiH groups to aliphatically unsaturated groups from (A1), (A2) and (E) is between 0.5 and 5, more preferably between 0.7 and 3.

Components (A1), (A2) and (B) used according to the invention are commercial products or can be prepared by processes conventional in chemistry.

As the hydrosilylation catalyst (D), which are also referred to as catalysts for the crosslinking of addition-crosslinking silicones, there can be used all catalysts known in the art. Component (D) can be a platinum group metal, for example platinum, rhodium, ruthenium, palladium, osmium or iridium, an organometallic compound or a combination thereof. Examples of component (D) are compounds such as hexachloroplatinic(IV) acid, platinum dichloride, platinum acetylacetonate, and complexes of said compounds which are encapsulated in a matrix or a core-shell-type structure. The platinum complexes of low molecular weight of the organopolysiloxanes include 1,3-diethenyl-1,1,3,3-tetramethyldisiloxane complexes with platinum. Further examples are platinum-phosphite complexes, platinum-phosphine complexes or alkyl-platinum complexes. These compounds can be encapsulated in a resin matrix.

The concentration of component (D) is sufficient for catalyzing the hydrosilylation reaction of components (A1), (A2), (E) and (B) on exposure. The amount of component (D) is 1-100 ppm (based on the metal), preferably between 1 and 25 ppm of the platinum group metal, according to the total weight of the components. The curing rate can be low if the constituent of the platinum group metal is less than 1 ppm. The use of more than 100 ppm of the platinum group metal is uneconomical or can reduce the stability of the composition.

Compound class (E) is understood as including branched silicone resins which, by their chemical structure, already form a three-dimensional network. They are described by the general empirical formula (I)

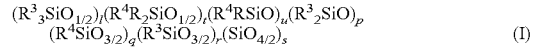

$$(R^3{}_3SiO_{1/2})_l(R^4R_2SiO_{1/2})_t(R^4RSiO_{1/2})_u(R^3{}_2SiO)_p(R^4SiO_{3/2})_q(R^3SiO_{3/2})_r(SiO_{4/2})_s \qquad (I)$$

wherein
$R^3$ denotes a linear aliphatic radical,
$R^4$ denotes an aliphatically unsaturated radical having a terminal C=C double bond,
l, t, u, p, q, r and s denote integers,
wherein the following apply:
l≥0, t≥0, u≥0, p≥0, q≥0, r≥0 and s≥0;
the content of aliphatically unsaturated groups in (E) is between 0.2 and 10 mmol/g.

Preferred radicals $R^3$ are short (C1-C4) linear aliphatic radicals, and the methyl radical is particularly preferred. Preferred radicals $R^4$ are short (C1-C4) linear aliphatically unsaturated radicals which have a terminal C=C double bond, the terminal vinyl radical being particularly preferred. In a preferred form, the indices are $l≥0$, $t≥0$, $u=0$, $p=0$, $q≥0$, $r≥0$ and $s≥0$, in a particularly preferred form the indices are $l≥0$, $t≥0$, $u=0$, $p=0$, $q=0$, $r=0$ and $s≥0$. The content of aliphatically unsaturated groups is preferably between 0.5 and 5 mmol/g and more preferably between 0.8 and 4 mmol/g.

The mean molar mass of this compound class (E) can vary within wide limits between $10^2$ and $10^6$ g/mol. Preferred mean molar masses are between $10^2$ and $10^5$ g/mol, and more preferred mean molar masses are between $10^3$ and $5·10^4$ g/mol.

The silicone elastomer compositions according to the invention can optionally comprise all further additives that have hitherto also been used in the preparation of addition-crosslinkable compositions. Examples of reinforcing fillers (F) which can be used as a component in the silicone compositions according to the invention are fumed or precipitated silicas having BET surface areas of at least 50 m$^2$/g as well as carbon blacks and activated carbons, such as furnace black and acetylene black, preference being given to fumed and precipitated silicas having BET surface areas of at least 50 m$^2$/g. The mentioned silica fillers can be hydrophilic in nature or can have been hydrophobized by known methods. When incorporating hydrophilic fillers, the addition of a hydrophobizing agent is necessary. The content of actively reinforcing filler in the crosslinkable composition according to the invention is in the range from 0 to 70% by weight, preferably from 0 to 50% by weight.

The silicone elastomer composition according to the invention can optionally comprise as constituents further additives (G) in an amount of up to 70% by weight, preferably from 0.0001 to 40% by weight. These additives can be rheological additives, corrosion inhibitors, oxidation inhibitors, light stabilizers, flame-retarding agents and agents for influencing the electrical properties, dispersing agents, solvents, adhesion promoters, pigments, dyes, plasticizers, organic polymers, heat stabilizers, etc. They include additives such as clays, lithopones, carbon blacks, graphite, metal oxides, metal carbonates, metal sulfates, metal salts of carboxylic acids, metal dusts, fibers such as glass fibers, plastics fibers, plastics powders, metal dusts, dyes, pigments, etc.

These fillers can additionally be heat-conducting or electrically conducting. Examples of heat-conducting fillers are aluminum nitride; barium titanate; beryllium oxide; boron nitride; diamond; graphite; magnesium oxide; particulate metal such as, for example, copper, gold, nickel or silver; silicon carbide; tungsten carbide; zinc oxide and a combination thereof. Heat-conducting fillers are known in the prior art and are available commercially. A combination of fillers with different particle sizes and different particle size distribution can be used.

The silicone elastomer composition according to the invention can additionally optionally comprise solvents (H). It must be ensured, however, that the solvent does not adversely affect the system as a whole. Suitable solvents are known in the prior art and are available commercially. The solvent can be, for example, an organic solvent having from 3 to 20 carbon atoms. Examples of solvents include aliphatic hydrocarbons such as nonane, decalin and dodecane; aromatic hydrocarbons such as mesitylene, xylene and toluene; esters such as ethyl acetate and butyrolactone; ethers such as n-butyl ether and polyethylene glycol monomethyl ether; ketones such as methyl isobutyl ketone and methyl pentyl ketone; silicone fluids such as linear, branched and cyclic polydimethylsiloxanes, and combinations of these solvents. The optimal concentration of a particular solvent in the silicone elastomer composition according to the invention can easily be determined by routine experiments. According to the weight of the compound, the amount of solvent can be, for example, between 0 and 95% or between 1 and 95%.

Inhibitors and stabilizers can be added as further optional components (K). They are used for purposively adjusting the processing time, response temperature and crosslinking speed of the silicone compositions according to the invention. These inhibitors and stabilizers are very well known in the field of addition-crosslinking compositions. Examples of conventional inhibitors are acetylenic alcohols, such as 1-ethynyl-1-cyclohexanol, 2-methyl-3-butyn-2-ol and 3.5-dimethyl-1-hexyn-3-ol, 3-methyl-1-dodecyn-3-ol, polymethylvinylcyclosiloxanes such as 1,3,5,7-tetravinyltetramethyltetracyclosiloxane low molecular weight silicone oils with methylvinyl-SiO$_{1/2}$ groups and/or R$_2$vinylSiO$_{1/2}$ end groups, such as divinyltetramethyldisiloxane, tetravinyldimethyldisiloxane, trialkyl cyanurates, alkyl maleates, such as diallyl maleate, dimethyl maleate and diethyl maleate, alkyl fumarates, such as diallyl fumarate and diethyl fumarate, organic hydroperoxides such as cumene hydroperoxide, tert-butyl hydroperoxide and pinane hydroperoxide, organic peroxides, organic sulfoxides, organic amines, diamines and amides, phosphates and phosphites, nitriles, triazoles, diaziridines and oximes. The action of these inhibitor additives (K) depends on their chemical structure, so that the concentration must be determined individually. Inhibitors and inhibitor mixtures are preferably added in an amount of from 0.00001% to 5%, based on the total weight of the mixture, preferably from 0.00005 to 2% and most preferably from 0.0001 to 1%.

One or more adhesion-promoting or adhesion-preventing substances can be added as further optional components (L). A combination of two or more adhesion-promoting and adhesion-preventing substances is also possible. There can be used as adhesion promoters transition metal chelates, in particular alkoxysilanes or a combination of alkoxysilane and a hydroxy-functional polyorganosiloxane. Unsaturated or epoxy-functional compounds can additionally be used, for example 3-glycidoxypropyl-alkoxy-alkylsilanes or (epoxycyclohexyl)-ethyl-alkoxy-alkylsilanes. Silanes carrying unsaturated organic groups are also suitable for this purpose, such as, for example, 3-methacryloyloxypropyl-alkoxysilanes, 3-acryloxypropyl-alkoxysilanes, vinyl-, allyl-, hexenyl- or undecenyl-alkoxysilanes.

Examples of epoxy-functional silanes are 3-glycidoxypropyl-trimethoxysilane, 3-glycidoxypropyltriethoxysilane, (epoxy-cyclohexyl)ethyldimethoxysilane, (epoxycyclohexyl)ethyl-diethoxysilane and a combination thereof. Examples of suitable unsaturated alkoxysilanes include vinyltrimethoxy-silane, allyltrimethoxysilane, allyltriethoxysilane, hexenyltrimethoxysilane, undecylenyltrimethoxysilane, 3-methacryloyloxypropyl trimethoxysilane, 3-methacryloyloxy-propyl-triethoxysilane, 3-acryloyloxypropyl-trimethoxysilane, 3-acryloyloxypropyl-triethoxysilane and a combination thereof.

Functional siloxanes can likewise be used. The siloxane corresponds to the reaction product of a hydroxy-terminated polyorganosiloxane with one or more above-described alkoxysilanes or a blend of the hydroxy-terminated polyorganosiloxane with one or more of the above-mentioned functional silanes. For example, a mixture of 3-glycidoxypropyltrimethoxysilane and the reaction product of hydroxy-terminated methylvinylsiloxane and 3-glycidoxypropyl-trimethoxysilane can be used.

These components can also be used in the form of a physical blend instead of a reaction product.

Partial hydrolysates of the above-described functional silanes can further be used. These are conventionally prepared either by reaction of the silane with water and subsequent preparation of the mixture, or by preparation of the mixture with subsequent partial hydrolysis.

The suitable transition metal chelates include titanates, zirconates such as, for example, zirconium acetylacetonate, aluminum chelates such as, for example, aluminum acetylacetonate, and a combination thereof. Transition metal chelates and their preparation processes are known in the prior art.

EXAMPLES

In the examples described below, all parts and percentages, unless indicated otherwise, are by weight. Unless indicated otherwise, the examples below are carried out at a pressure of the surrounding atmosphere, that is to say approximately at 1000 hPa, and at room temperature, that is to say at approximately 20° C., or at a temperature that establishes itself when the reactants are combined at room temperature without additional heating or cooling. In the following, all viscosities relate to the dynamic viscosity at a temperature of 20° C. and a shear of $1\ s^{-1}$. The examples which follow explain the invention without implying any limitation. All the examples show the total composition of the crosslinked products, irrespective of whether they are formulated as one- or two-component compositions.

The following abbreviations are used:
Cat. platinum catalyst
Ex. example
No. number
PDMS polydimethylsiloxane
% by weight corresponds to percent by weight
Shore A/D hardness according to DIN 53505
TPR tear propagation resistance according to ASTM D624-B-94 in N/mm
Visco dynamic viscosity, shear rate d
EB elongation at break according to DIN 53504-85S1 in %
TS tear strength according to DIN 53504-85S1 in $N/mm^2$ Example 1

Silicone Elastomer Composition 1

5% by weight of a vinyl-terminated linear PDMS having a mean molecular weight of 8000 g/mol
5% by weight of a vinyl-terminated linear PDMS having a mean molecular weight of 110,000 g/mol
16% by weight of a linear SiH comb crosslinker with a hydrogen content of 0.75% by weight having a mean molecular weight of 3000 g/mol
74% by weight of a branched vinyl-group-containing silicone resin having a mean molar mass of 4000 g/mol and a content of aliphatically unsaturated groups of 1 mmol/g
10 ppm of platinum catalyst, based on the metal
The ratio Si—H groups to aliphatically unsaturated groups is: 1.6

Example 2

Silicone Elastomer Composition 2

8% by weight of a vinyl-terminated linear PDMS having a mean molecular weight of 8000 g/mol
5% by weight of a vinyl-containing, linear PDMS having lateral vinyl groups and a molecular weight of 30,000 g/mol
6% by weight of a vinyl-terminated linear PDMS having a mean molecular weight of 110,000 g/mol
18% by weight of a linear SiH comb crosslinker with a hydrogen content of 1.15% by weight having a mean molecular weight of 3000 g/mol
63% by weight of a branched vinyl-group-containing silicone resin having a mean molar mass of 4000 g/mol and a content of aliphatically unsaturated groups of 1 mmol/g
10 ppm of platinum catalyst, based on the metal
The ratio Si—H groups to aliphatically unsaturated groups is: 3.4

Example 3

Silicone Elastomer Composition 3

7% by weight of a vinyl-terminated linear PDMS having a mean molecular weight of 8000 g/mol
6% by weight of a vinyl-terminated linear PDMS having a mean molecular weight of 110,000 g/mol
22% by weight of a linear SiH comb crosslinker with a hydrogen content of 1.15% by weight having a mean molecular weight of 3000 g/mol
65% by weight of a branched vinyl-group-containing silicone resin having a mean molar mass of 4000 g/mol and a content of aliphatically unsaturated groups of 1 mmol/g
10 ppm of platinum catalyst, based on the metal
The ratio Si—H groups to aliphatically unsaturated groups is: 4.0

Example 4

Silicone Elastomer Composition 4

5% by weight of a vinyl-terminated linear PDMS having a mean molecular weight of 8000 g/mol
5% by weight of a vinyl-terminated linear PDMS having a mean molecular weight of 110,000 g/mol
24% by weight of a linear SiH comb crosslinker with a hydrogen content of 1.15% by weight having a mean molecular weight of 3000 g/mol
66% by weight of a branched vinyl-group-containing silicone resin having a mean molar mass of 4000 g/mol and a content of aliphatically unsaturated groups of 0.8 mmol/g
10 ppm of platinum catalyst, based on the metal
The ratio Si—H groups to aliphatically unsaturated groups is: 4.8

Example 5

Silicone Elastomer Composition 5

8% by weight of a vinyl-terminated linear PDMS having a mean molecular weight of 8000 g/mol
11% by weight of a vinyl-terminated linear PDMS having a mean molecular weight of 16,000 g/mol
4% by weight of a vinyl-terminated linear PDMS having a mean molecular weight of 110,000 g/mol
6% by weight of a linear SiH comb crosslinker with a hydrogen content of 1.15% by weight having a mean molecular weight of 3000 g/mol
71% by weight of a branched vinyl-group-containing silicone resin having a mean molar mass of 4000 g/mol and a content of aliphatically unsaturated groups of 0.8 mmol/g
10 ppm of platinum catalyst, based on the metal
The ratio Si—H groups to aliphatically unsaturated groups is: 0.9

Example C6

Silicone Elastomer Composition 6 (Comparison Example)

20% by weight of a vinyl-terminated linear PDMS having a mean molecular weight of 8000 g/mol 20% by weight of a vinyl-terminated linear PDMS having a mean molecular weight of 16,000 g/mol 10% by weight of a linear SiH comb crosslinker with a hydrogen content of 1.15% by weight having a mean molecular weight of 3000 g/mol 50% by weight of a branched vinyl-group-containing silicone resin having a mean molar mass of 4000 g/mol and a content of aliphatically unsaturated groups of 0.7

10 ppm of platinum catalyst, based on the metal

The ratio Si—H groups to aliphatically unsaturated groups is: 2.6

The results of the measurements of the mechanical strength of the crosslinked silicone rubbers are given in Table 1. The Shore D hardness was determined on a sample 6 mm thick, which had been crosslinked for one hour at 200° C. for that purpose.

TABLE 1

|  | Shore D | TPR | ET | TS | according to the invention |
|---|---|---|---|---|---|
| Ex. 1 | 50 | 5 | 7 | 5 | yes |
| Ex. 2 | 35 | 7 | 9 | 4 | yes |
| Ex. 3 | 40 | 8 | 6 | 4 | yes |
| Ex. 4 | 38 | 8 | 8 | 4 | yes |
| Ex. 5 | 30 | 10 | 20 | 3 | yes |
| Ex. C6 | 20 | 2 | 4 | 3 | no |

Table 2 shows the results of the viscosity determination for the ratio of the dynamic viscosity of the examples at shear rates of 1 s$^{-1}$ and 100 s$^{-1}$ and a temperature of 20° C.

TABLE 2

|  | Visco d = 1/Visco d = 100 | 3-point flexural modulus |
|---|---|---|
| Ex. 1 | 1.04 | 150 |
| Ex. 2 | 1.03 | 110 |
| Ex. 3 | 1.03 | 130 |
| Ex. 4 | 1.02 | 120 |
| Ex. 5 | 1.02 | 80 |
| Ex. C6* | 1.02 | 20 |

*not according to the invention

The invention claimed is:

1. An addition-crosslinkable silicone elastomer composition comprising:
   (A1) 1-10% by weight of at least one linear organopolysiloxane containing at least 2 SiC-bonded radicals having aliphatic carbon-carbon multiple bonds, wherein the mean molar mass of (A1) is not more than 15,000 g/mol,
   (A2) 1-20% by weight of at least one linear organopolysiloxane containing at least 2 SiC-bonded radicals having aliphatic carbon-carbon multiple bonds, wherein the mean molar mass of (A2) is at least 40,000 g/mol,
   (B) 1-40% by weight of at least one organopolysiloxane containing at least three Si-bonded hydrogen atoms per molecule, having a content of Si-bonded hydrogen of from 0.04 to 1.7% by weight and a mean molar mass of not more than 20,000 g/mol,
   (D) 1-100 ppm (based on the metal) of a hydrosilylation catalyst,
   (E) 50-99% by weight of at least one branched silicone resin of the general empirical formula (I)

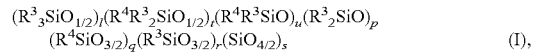

(I), wherein
R$^3$ denotes a linear aliphatic radical,
R$^4$ denotes an aliphatically unsaturated radical having a terminal C=C double bond,
l, t, u, p, q, r and s denote integers,
wherein the following apply:
l≥0, t≥0, u≥0, p≥0, q≥0, r≥0 and s≥0; and
the content of aliphatically unsaturated groups in (E) is between 0.2 and 10 mmol/g; and
(E) has a mean molar mass of not more than 10$^5$ g/mol, with the proviso that the ratio of the Si—H groups provided by component (B) to the aliphatically unsaturated groups provided by components (A1), (A2) and (E) is between 0.5 and 5 and the ratio of the dynamic viscosity of the silicone elastomer composition at shear rates of 1 s$^{-1}$ and 100 s$^{-1}$ and a temperature of 20° C. is not more than 1.2 and after crosslinking exhibits a Shore D hardness of at least 25.

2. A process for the preparation of a silicone elastomer compositions of claim 1, wherein all the components are mixed together.

3. A molding, adhesive bond or optical component, comprising a cured silicone elastomer of claim 1.

4. The adhesive bond of claim 3, which is a temporary adhesive bond.

5. In the processing of a semiconductor wafer wherein an adhesive is used to bond the wafer to a substrate in temporary fashion, the improvement comprising employing an adhesive which is a curable silicone elastomer composition of claim 1.

* * * * *